United States Patent
Hung et al.

(10) Patent No.: US 11,682,653 B2
(45) Date of Patent: Jun. 20, 2023

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Chih-Ming Hung, Kaohsiung (TW); Meng-Jen Wang, Kaohsiung (TW); Tsung-Yueh Tsai, Kaohsiung (TW); Jen-Kai Ou, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 136 days.

(21) Appl. No.: 17/180,364

(22) Filed: Feb. 19, 2021

(65) Prior Publication Data

US 2021/0175205 A1 Jun. 10, 2021

Related U.S. Application Data

(63) Continuation of application No. 16/709,623, filed on Dec. 10, 2019, now Pat. No. 10,937,761, which is a
(Continued)

(51) Int. Cl.
*H01L 23/00* (2006.01)
*H01L 23/544* (2006.01)
(Continued)

(52) U.S. Cl.
CPC ............ *H01L 24/96* (2013.01); *H01L 21/561* (2013.01); *H01L 21/565* (2013.01);
(Continued)

(58) Field of Classification Search
CPC .................. H01L 23/3135; H01L 23/315
(Continued)

(56) References Cited

U.S. PATENT DOCUMENTS

| 4,600,600 | A | 7/1986 | Pammer et al. |
| 5,289,346 | A | 2/1994 | Carey et al. |

(Continued)

FOREIGN PATENT DOCUMENTS

| CN | 102543779 A | 7/2012 |
| CN | 103000574 A | 3/2013 |

(Continued)

OTHER PUBLICATIONS

The State Intellectual Property Office of People's Republic of China, First Office Action (machine translation), Chinese Pat. App. No. 201810233866.5, dated Feb. 9, 2021, all pages. (Year: 2021).*

(Continued)

*Primary Examiner* — Victoria K. Hall
(74) *Attorney, Agent, or Firm* — Foley & Lardner LLP

(57) ABSTRACT

A semiconductor device includes: a substrate having a first surface and a second surface opposite to the first surface; an electronic component disposed on the first surface of the substrate; a sensor disposed adjacent to the second surface of the substrate; an electrical contact disposed on the first surface of the substrate; and a package body exposing a portion of the electrical contact.

13 Claims, 12 Drawing Sheets

Related U.S. Application Data continuation of application No. 15/918,906, filed on Mar. 12, 2018, now Pat. No. 10,522,505.

(60) Provisional application No. 62/482,431, filed on Apr. 6, 2017.

(51) Int. Cl.
| | |
|---|---|
| *H01L 21/56* | (2006.01) |
| *H01L 27/146* | (2006.01) |
| *H01L 23/31* | (2006.01) |
| *G06K 9/00* | (2022.01) |
| *G06V 40/13* | (2022.01) |

(52) U.S. Cl.
CPC ............ *H01L 21/568* (2013.01); *H01L 23/31* (2013.01); *H01L 23/315* (2013.01); *H01L 23/3107* (2013.01); *H01L 23/3121* (2013.01); *H01L 23/544* (2013.01); *H01L 24/13* (2013.01); *H01L 27/1469* (2013.01); *H01L 27/14618* (2013.01); *H01L 27/14634* (2013.01); *H01L 27/14636* (2013.01); *G06V 40/1318* (2022.01); *G06V 40/1329* (2022.01); *H01L 24/16* (2013.01); *H01L 24/32* (2013.01); *H01L 24/73* (2013.01); *H01L 2223/54426* (2013.01); *H01L 2223/54486* (2013.01); *H01L 2224/13014* (2013.01); *H01L 2224/1319* (2013.01); *H01L 2224/13111* (2013.01); *H01L 2224/13147* (2013.01); *H01L 2224/13583* (2013.01); *H01L 2224/13611* (2013.01); *H01L 2224/13639* (2013.01); *H01L 2224/13644* (2013.01); *H01L 2224/13647* (2013.01); *H01L 2224/13655* (2013.01); *H01L 2224/16145* (2013.01); *H01L 2224/16225* (2013.01); *H01L 2224/16227* (2013.01); *H01L 2224/32145* (2013.01); *H01L 2224/32225* (2013.01); *H01L 2224/73204* (2013.01); *H01L 2224/95001* (2013.01); *H01L 2924/014* (2013.01); *H01L 2924/15321* (2013.01); *H01L 2924/181* (2013.01); *H01L 2924/19105* (2013.01)

(58) Field of Classification Search
USPC .............. 257/433, 737, 738, 23.123, 23.124, 257/23.125, 23.128, 787–793
See application file for complete search history.

(56) References Cited

U.S. PATENT DOCUMENTS

| | | | |
|---|---|---|---|
| 5,496,775 A | 3/1996 | Brooks | |
| 5,554,887 A | 9/1996 | Sawai et al. | |
| 5,666,008 A | 9/1997 | Tomita et al. | |
| 5,677,566 A | 10/1997 | King et al. | |
| 5,729,051 A | 3/1998 | Nakamura | |
| 5,824,569 A | 10/1998 | Brooks et al. | |
| 5,888,850 A | 3/1999 | Havens et al. | |
| 5,925,934 A | 7/1999 | Lim | |
| 5,933,713 A | 8/1999 | Farnworth | |
| 5,973,337 A | 10/1999 | Knapp et al. | |
| 6,043,564 A | 3/2000 | Brooks et al. | |
| 6,455,927 B1 | 9/2002 | Glenn et al. | |
| 6,492,699 B1 | 12/2002 | Glenn et al. | |
| 6,495,916 B1 | 12/2002 | Ohuchi et al. | |
| 6,541,848 B2 | 4/2003 | Kawahara et al. | |
| 6,551,863 B2 | 4/2003 | Johnson et al. | |
| 6,566,745 B1 | 5/2003 | Beyne et al. | |
| 6,653,731 B2 | 11/2003 | Kato et al. | |
| 6,710,454 B1 | 3/2004 | Boon | |
| 6,833,612 B2 | 12/2004 | Kinsman | |
| 6,881,611 B1 | 4/2005 | Fukasawa et al. | |
| 6,888,222 B2 | 5/2005 | Shizuno | |
| 6,919,232 B2 | 7/2005 | Hedler et al. | |
| 6,949,824 B1 | 9/2005 | Prindiville | |
| 7,002,245 B2 | 2/2006 | Huang et al. | |
| 7,015,128 B1 | 3/2006 | Chiang et al. | |
| 7,138,707 B1 | 11/2006 | Lee et al. | |
| 7,160,478 B2 | 1/2007 | Leib et al. | |
| 7,195,957 B2 | 3/2007 | Koon et al. | |
| 7,199,438 B2 | 4/2007 | Appelt et al. | |
| 7,268,421 B1 | 9/2007 | Lin | |
| 7,276,783 B2 | 10/2007 | Goller et al. | |
| 7,372,122 B2 | 5/2008 | Kang | |
| 7,382,060 B2 | 6/2008 | Farnworth et al. | |
| 7,646,102 B2 | 1/2010 | Boon | |
| 7,656,048 B2 | 2/2010 | Fauty et al. | |
| 7,714,453 B2 | 5/2010 | Khan et al. | |
| 7,772,698 B2 | 8/2010 | Hwan et al. | |
| 7,795,134 B2 | 9/2010 | Sulfridge | |
| 7,812,447 B2 | 10/2010 | Boon | |
| 7,816,750 B2 | 10/2010 | Chua | |
| 7,952,198 B2 | 5/2011 | Lin | |
| 7,982,310 B2 | 7/2011 | Ito | |
| 8,008,762 B2 | 8/2011 | Bolken et al. | |
| 8,026,601 B2 | 9/2011 | Cho | |
| 8,035,213 B2 | 10/2011 | Lee et al. | |
| 8,035,235 B2 | 10/2011 | Jang et al. | |
| 8,264,091 B2 | 9/2012 | Cho et al. | |
| 8,404,520 B1 | 3/2013 | Chau et al. | |
| 8,476,591 B2 | 7/2013 | Kierse et al. | |
| 8,482,111 B2 | 7/2013 | Haba | |
| 8,633,598 B1* | 1/2014 | St. Amand .......... | H01L 23/3135 257/782 |
| 8,704,337 B2 | 4/2014 | Takano et al. | |
| 8,772,919 B2 | 7/2014 | Chien et al. | |
| 8,981,543 B2 | 3/2015 | Kwon et al. | |
| 9,013,035 B2 | 4/2015 | Zhao et al. | |
| 9,023,691 B2 | 5/2015 | Mohammed et al. | |
| 9,034,696 B2 | 5/2015 | Mohammed et al. | |
| 9,041,200 B2 | 5/2015 | Yu | |
| 9,093,435 B2 | 7/2015 | Sato et al. | |
| 9,209,146 B2 | 12/2015 | Kim et al. | |
| 9,324,681 B2 | 4/2016 | Haba et al. | |
| 9,613,895 B1 | 4/2017 | Shih | |
| 9,670,445 B1 | 6/2017 | Kuo et al. | |
| 9,691,679 B2 | 6/2017 | Co et al. | |
| 10,008,533 B2 | 6/2018 | Jun | |
| 10,242,940 B2* | 3/2019 | Yeh .................... | H01L 25/18 |
| 10,269,671 B2* | 4/2019 | Hsu .................... | H01L 24/73 |
| 10,332,854 B2 | 6/2019 | Katkar et al. | |
| 10,522,505 B2* | 12/2019 | Hung .............. | H01L 27/14634 |
| 10,737,933 B2 | 8/2020 | Reagan et al. | |
| 10,748,828 B2 | 8/2020 | Jung et al. | |
| 10,748,947 B2 | 8/2020 | Masuda et al. | |
| 10,937,761 B2* | 3/2021 | Hung .................. | H01L 23/31 |
| 2002/0125568 A1 | 9/2002 | Jiang et al. | |
| 2002/0167085 A1 | 11/2002 | Ohuchi et al. | |
| 2002/0195708 A1 | 12/2002 | Stephenson et al. | |
| 2004/0012088 A1 | 1/2004 | Fukasawa et al. | |
| 2005/0046000 A1 | 3/2005 | Seng et al. | |
| 2006/0244149 A1 | 11/2006 | Nakamura et al. | |
| 2006/0261475 A1 | 11/2006 | Boon | |
| 2006/0278971 A1 | 12/2006 | Barnes et al. | |
| 2007/0080466 A1 | 4/2007 | Chou et al. | |
| 2007/0187771 A1 | 8/2007 | Takaike | |
| 2007/0290322 A1 | 12/2007 | Zhao et al. | |
| 2008/0009102 A1 | 1/2008 | Yang et al. | |
| 2008/0308928 A1 | 12/2008 | Chang et al. | |
| 2009/0166785 A1 | 7/2009 | Camacho et al. | |
| 2009/0267171 A1 | 10/2009 | Yean et al. | |
| 2010/0244233 A1 | 9/2010 | Kim et al. | |
| 2011/0175179 A1 | 7/2011 | Chiu et al. | |
| 2011/0187005 A1 | 8/2011 | Pagaila et al. | |
| 2012/0020026 A1 | 1/2012 | Oganesian et al. | |
| 2012/0146181 A1 | 6/2012 | Lin et al. | |
| 2012/0228764 A1 | 9/2012 | Tseng et al. | |
| 2012/0261820 A1 | 10/2012 | Vittu | |
| 2012/0306062 A1 | 12/2012 | Kim et al. | |
| 2013/0037935 A1 | 2/2013 | Xue et al. | |
| 2013/0069252 A1 | 3/2013 | Han et al. | |
| 2013/0075927 A1 | 3/2013 | Chi et al. | |

(56) References Cited

U.S. PATENT DOCUMENTS

| | | | |
|---|---|---|---|
| 2013/0187258 A1* | 7/2013 | Lu | H01L 24/97 257/621 |
| 2013/0228917 A1 | 9/2013 | Yoon et al. | |
| 2013/0295725 A1 | 11/2013 | Park et al. | |
| 2014/0035154 A1 | 2/2014 | Geitner et al. | |
| 2014/0124916 A1 | 5/2014 | Yu et al. | |
| 2014/0183732 A1 | 7/2014 | Huang et al. | |
| 2014/0210109 A1 | 7/2014 | Tanaka et al. | |
| 2014/0327155 A1 | 11/2014 | Kang et al. | |
| 2015/0061101 A1 | 3/2015 | Le et al. | |
| 2015/0115443 A1 | 4/2015 | Oh et al. | |
| 2015/0179615 A1 | 6/2015 | Watanabe et al. | |
| 2015/0255500 A1* | 9/2015 | Akahoshi | H01L 24/19 257/434 |
| 2015/0325507 A1 | 11/2015 | Uzoh et al. | |
| 2015/0325543 A1 | 11/2015 | Katkar et al. | |
| 2015/0357319 A1* | 12/2015 | Yu | H01L 24/29 438/107 |
| 2016/0005628 A1 | 1/2016 | Yap et al. | |
| 2016/0163612 A1 | 6/2016 | Hsu et al. | |
| 2016/0238439 A1 | 8/2016 | Chu et al. | |
| 2017/0018590 A1* | 1/2017 | Yiu | H01L 24/19 |
| 2017/0110382 A1 | 4/2017 | Kim | |
| 2018/0108602 A1 | 4/2018 | Yeh et al. | |
| 2019/0013299 A1 | 1/2019 | Lee | |
| 2019/0035669 A1 | 1/2019 | Talledo | |
| 2019/0206824 A1 | 7/2019 | Lu | |

FOREIGN PATENT DOCUMENTS

| | | |
|---|---|---|
| CN | 103579190 A | 2/2014 |
| JP | 2007-012762 A | 1/2007 |
| KR | 10-2010-0129643 A | 12/2010 |

OTHER PUBLICATIONS

The State Intellectual Property Office of People's Republic of China, Second Office Action (machine translation), Chinese Pat. App. No. 201810233866.5, dated Sep. 16, 2021, all pages. (Year: 2021).*

Office Action for corresponding Chinese Patent Application No. 201810233866.5, dated Feb. 9, 2021, 14 pages.

Search Report with English translation for corresponding Chinese Patent Application No. 201810233866.5, dated Feb. 9, 2021, 7 pages.

Office Action for corresponding Chinese Patent Application No. 201810233866.5, dated Sep. 16, 2021, 6 pages.

U.S. Appl. No. 15/655,724, filed Jul. 20, 2017, Advanced Semiconductor Engineering, Inc.

Final Office Action for U.S. Appl. No. 16/709,623, dated Aug. 11, 2020, 19 pages.

Non-Final Office Action for U.S. Appl. No. 16/709,623, dated Mar. 26, 2020, 26 pages.

Notice of Allowance for U.S. Appl. No. 15/918,906, dated Aug. 21, 2019, 21 pages.

Notice of Allowance for U.S. Appl. No. 16/709,623, dated Oct. 27, 2020, 10 pages.

* cited by examiner

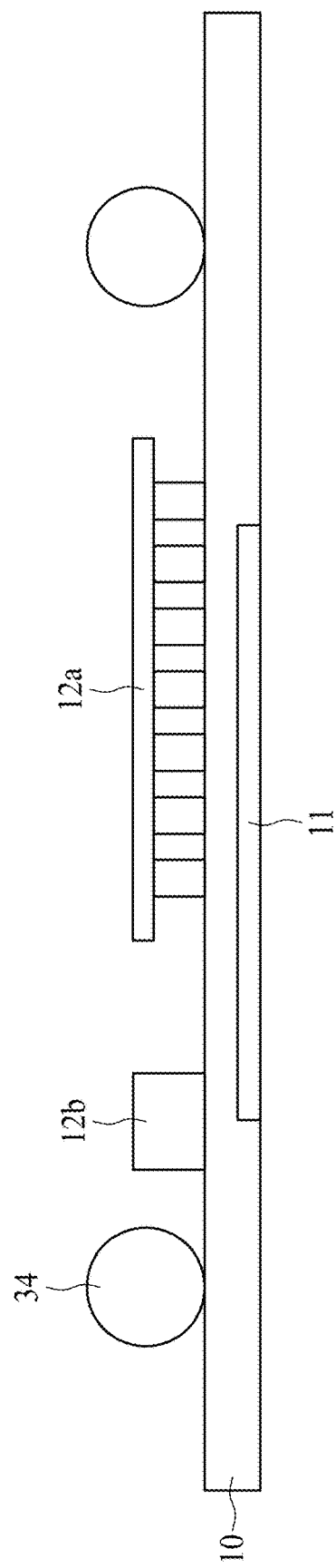

SEMICONDUCTOR DEVICE PACKAGE AND METHOD FOR MANUFACTURING THE SAME

CROSS-REFERENCE TO RELATED APPLICATIONS

This application is a continuation of U.S. patent application Ser. No. 16/709,623, filed Dec. 10, 2019, which is a continuation of U.S. patent application Ser. No. 15/918,906, filed Mar. 12, 2018, which claims the benefit of and priority to U.S. Provisional Patent Application 62/482,431, filed Apr. 6, 2017, which is incorporated herein by reference in its entirety.

BACKGROUND

1. Technical Field

The present disclosure relates generally to a semiconductor device package, and to a fan-out ball (or bump) grid array (BGA) package structure.

2. Description of the Related Art

There is demand for electronic products that include semiconductor device packages with greater efficiency, higher performance, and smaller dimensions.

BGA packages may be used to meet the demand for packages having higher lead counts and smaller footprints. A BGA package can be a square package with terminals, in the form of an array of solder balls or bumps, protruding from the bottom of the package. These terminals can be mounted on a plurality of pads located on a surface of a printed circuit board (PCB), or other interconnection structure. Traces of the BGA can be fabricated on laminated substrates (e.g., substrates including bismaleimide triazine (BT)) or on polyimide-based films. Therefore, a large area of such a substrate or a film can be used to route the interconnection. A BGA can provide for a low ground or power inductance thereby implementing ground or power nets via a short current path to the PCB. To increase structural strength, a BGA package with double-sided molding can be implemented.

SUMMARY

In some embodiments, a semiconductor device includes: a substrate having a first surface and a second surface opposite to the first surface; an electronic component disposed on the first surface of the substrate; a sensor disposed adjacent to the second surface of the substrate; an electrical contact disposed on the first surface of the substrate; and a package body exposing a portion of the electrical contact.

In some embodiments, a semiconductor device includes: a substrate having a first surface, a second surface opposite to the first surface and a third surface extending between the first surface and the second surface; an electronic component disposed on the first surface of the substrate; a sensor disposed adjacent to the second surface of the substrate; and a package body covering the second surface and the third surface of the substrate.

In some embodiments, a method of manufacturing a semiconductor device includes: (a) providing a structure including a substrate having a first surface and a second surface opposite to the first surface, a first electrical contact and a first package body encapsulating the first surface and the first electrical contact, the first package body exposing a portion of the first electrical contact; (b) encapsulating the structure by a second package body; and (c) exposing the first electrical contact from the second package body.

In some embodiments, a method of manufacturing an semiconductor device includes: (a) providing a structure including a substrate having a first surface and a second surface opposite to the first surface and a first electrical contact disposed on the first surface; (b) encapsulating the first surface and the first electrical contact by a package body; and (c) forming a notch in the package body adjacent to the first electrical contact.

BRIEF DESCRIPTION OF THE DRAWINGS

FIG. 4A, FIG. 4B, FIG. 4C and FIG. 4D illustrate a method of manufacturing surface mount structures in accordance with some embodiments of the present disclosure.

Figure 1A:
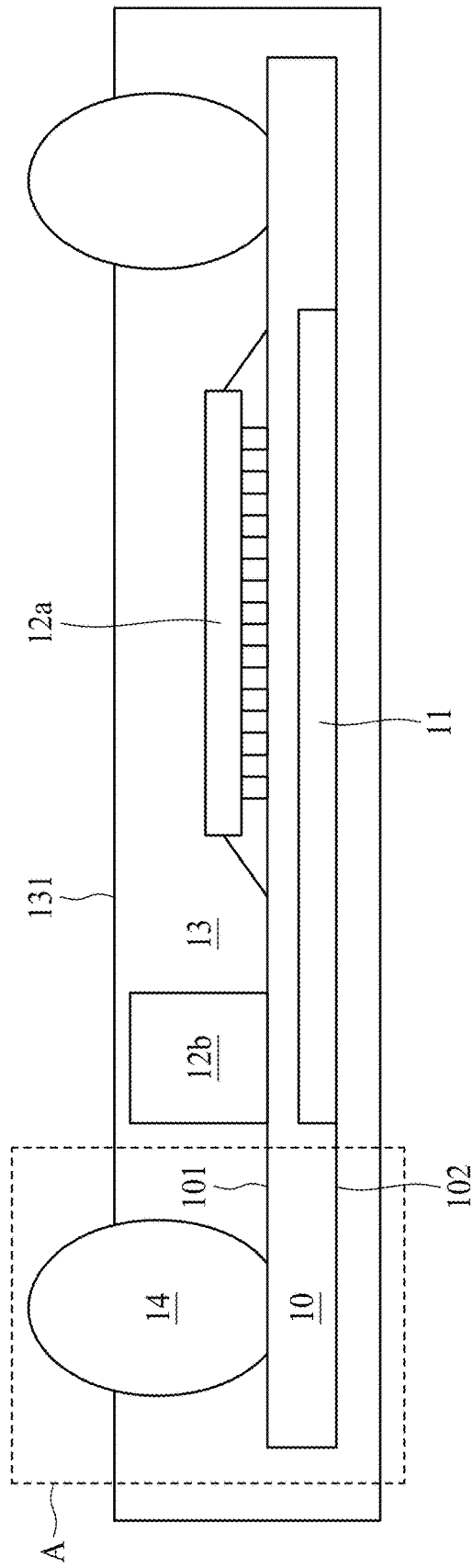
FIG. 1A illustrates a cross-sectional view of a surface mount structure in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a surface mount structure 1 in accordance with some embodiments of the present disclosure. The surface mount structure 1 includes a substrate 10, a sensor 11, electronic components 12a, 12b, a package body 13 and an electrical contact 14.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. The substrate 10 has a surface 101 (also referred to a first surface) and a surface 102 (also referred to as a second surface) opposite to the surface 101.

The sensor 11 is disposed within the substrate 10 and is disposed at, adjacent to, or embedded in, the surface 102 of the substrate 10. For example, at least a portion of the sensor 11 is exposed from the surface 102 of the substrate 10. In some embodiments, the portion of the sensor 11 exposed from the surface 102 of the substrate 10 is substantially coplanar with the surface 102 of the substrate 10. In some embodiments, the portion of the sensor 11 exposed from the surface 102 of the substrate 10 is a sensing area of the sensor 11. In some embodiments, the sensor 11 can be used for, for example, finger print sensing or any other light-sensing purposes.

The electronic components 12a and 12b are disposed on the surface 101 of the substrate 10. In some embodiments, the electrical component 12a may be an active component, such as an integrated circuit (IC) chip or a die. The electrical component 12b may be a passive electrical component, such as a capacitor, a resistor, an inductor and a combination thereof. Each or either of the electronic component 12a, 12b may be electrically connected to one or more other electronic components 12a, 12b and/or to the substrate 10 (e.g., to the RDL), and electrical connection may be attained by way of flip-chip or wire-bond techniques.

The electrical contact 14 is disposed on the surface 101 of the substrate. The electrical contact 14 may provide for external connection for the surface mount structure 1.

The package body 13 is disposed on the surfaces 101 and 102 of the substrate 10. The package body 13 covers the surfaces 101 and 102 of the substrate 10. The package body 13 covers the exposed portion of the sensor 11. The package body 13 covers the electronic component 12a. The package body 13 covers the electronic component 12b. The package body 13 covers a portion of the electrical contact 14. In some embodiments, the package body 13 includes an epoxy resin having fillers, a molding compound (e.g., an epoxy molding compound or other molding compound), a polyimide, a phenolic compound or material, a material with a silicone dispersed therein, or a combination thereof. In some embodiments, the package body 13 may include transparent material depending on design specifications (e.g. material that is about 80% or more transmissive, about 90% or more transmissive, or about 95% or more transmissive for light that the sensor 11 is configured to process). In some embodiments, the package body 13 may include opaque materials depending on design specifications (e.g. material that is about 20% or less transmissive, about 10% or less transmissive, or about 5% or less transmissive for light that the sensor 11 is configured to process). In some embodiments, the package body 13 has a surface 131 (e.g. from which the electrical contact 14 protrudes) that is substantially planar.

Figure 1B:
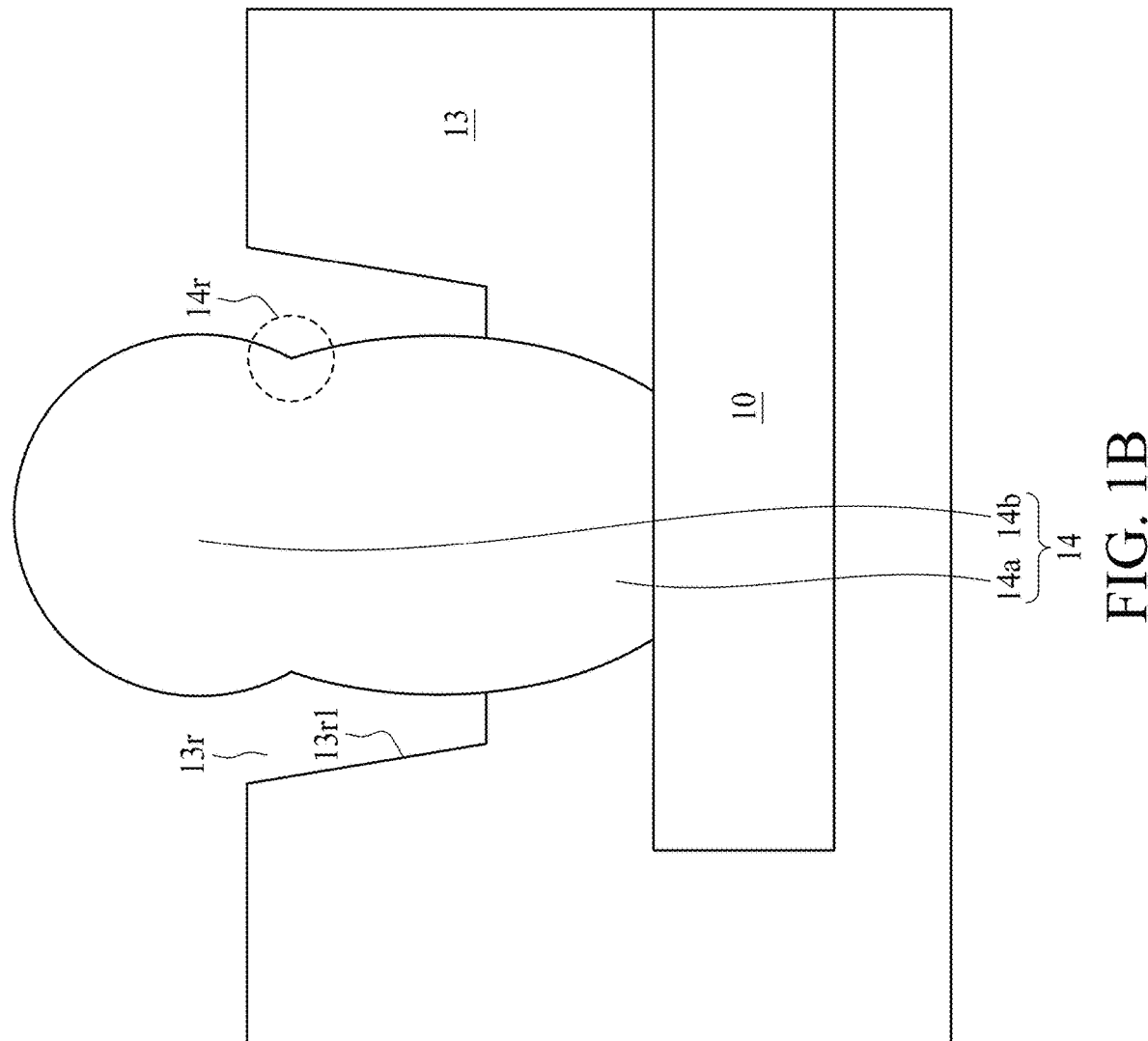
FIG. 1B illustrates an enlarged view of a portion of the surface mount structure in FIG. 1A in accordance with some embodiments of the present disclosure.

Referring to FIG. 1B, which illustrates an enlarged view of a portion of the surface mount structure 1 in FIG. 1A enclosed by a dotted-line square A, the electrical contact 14 includes two portions, referred to herein as electrical contacts 14a and 14b. The electrical contacts 14a and 14b may constitute a monolithic or integrally formed electrical contact 14. The electrical contact 14a is disposed on the surface 101 of the substrate 10 and the electrical contact 14b is disposed on the electrical contact 14a. In some embodiments, the electrical contact 14 defines a recess, indentation, or neck 14r adjacent to an interface between the electrical contact 14a and the electrical contact 14b. In some embodiments, one or more electrical contacts 14 may surround or be disposed around a periphery of the electronic components 12a, 12b and can be used to fan-out or fan-in the inputs and outputs of the electronic components 12a, 12b. In some embodiments, the electrical contacts 14a, 14b are Controlled Collapse Chip Connection (C4) bumps, BGA bumps or Land Grid Array (LGA) bumps.

The package body 13 encapsulates a portion of the electrical contact 14a. The package body 13 exposes a portion of the electrical contact 14a. The package body 13 exposes the electrical contact 14b (e.g. completely exposes the electrical contact 14b). The package body 13 is spaced from a portion of the electrical contact 14a by a distance. The package body 13 is spaced from the electrical contact 14b by a distance. The package body 13 has a sidewall 13r1 which defines a space or recess 13r to accommodate the electrical contact 14b and a portion of the electrical contact 14a. The sidewall 13r1 of the package body 13 is spaced apart from a portion of the electrical contact 14a. The sidewall 13r1 of the package body 13 is spaced apart from the electrical contact 14b. There is a gap between the sidewall 13r1 of the package body 13 and a portion of the electrical contact 14a. There is a gap between the sidewall 13r1 of the package body 13 and the electrical contact 14b.

FIG. 2A, FIG. 2B, FIG. 2C and FIG. 2D illustrate various stages of a method of manufacturing surface mount structures in accordance with some embodiments of the present disclosure. In some embodiments, the method shown in FIG. 2A, FIG. 2B, FIG. 2C and FIG. 2D can be used to manufacture the surface mount structure 1 in FIG. 1A.

Figure 2A:
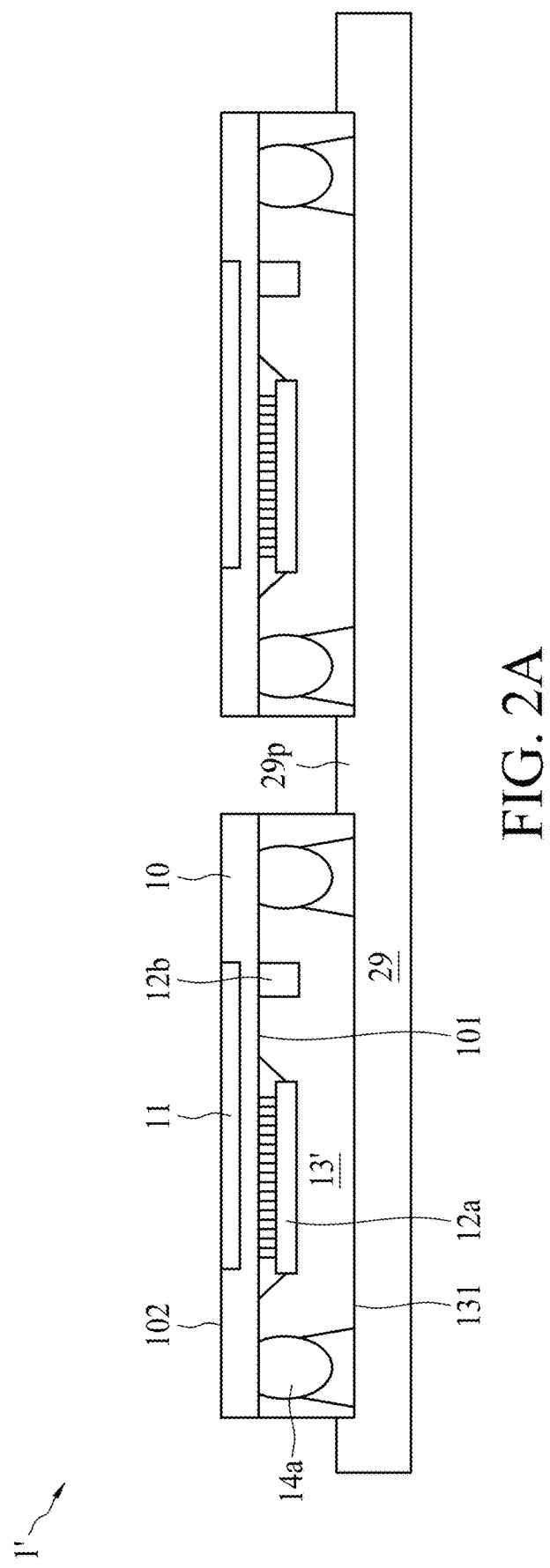
FIG. 2A, FIG. 2B, FIG. 2C and FIG. 2D illustrate a method of manufacturing surface mount structures in accordance with some embodiments of the present disclosure.

Referring to FIG. 2A, a plurality of surface mount structures including a surface mount structure 1' (e.g. a plurality of surface mount structures 1') are provided on a carrier 29. The surface mount structure 1' is similar to the surface mount structure 1 as shown in FIG. 1A and FIG. 1B, and the differences therebetween include that the surface mount structure 1' omits the electrical contact 14b and that the package body 13' does not covers the surface 102 of the substrate 10.

In some embodiments, the surface mount structure 1' in FIG. 2A may be formed by the following operations: (i) providing a substrate strip including the substrate 10; (ii) respectively mounting electronic components 12a, 12b and electrical contacts 14a on substrates (including the substrate 10) of the substrate strip by using, for example, surface mount technology (SMT); (iii) forming the package body 13' to cover the electronic components 12a, 12b and the electrical contacts 14a by a molding technique, such as transfer molding or compression molding; (iv) removing a portion of the package body 13' to expose a portion of the electrical contacts 14a by, for example, laser, drilling or other suitable processes; (v) sawing the substrate strip into individual surface mount structures including the surface mount structure 1'; and (vi) disposing the surface mount structures including the surface mount structure 1' on the carrier 29.

Figure 2B:
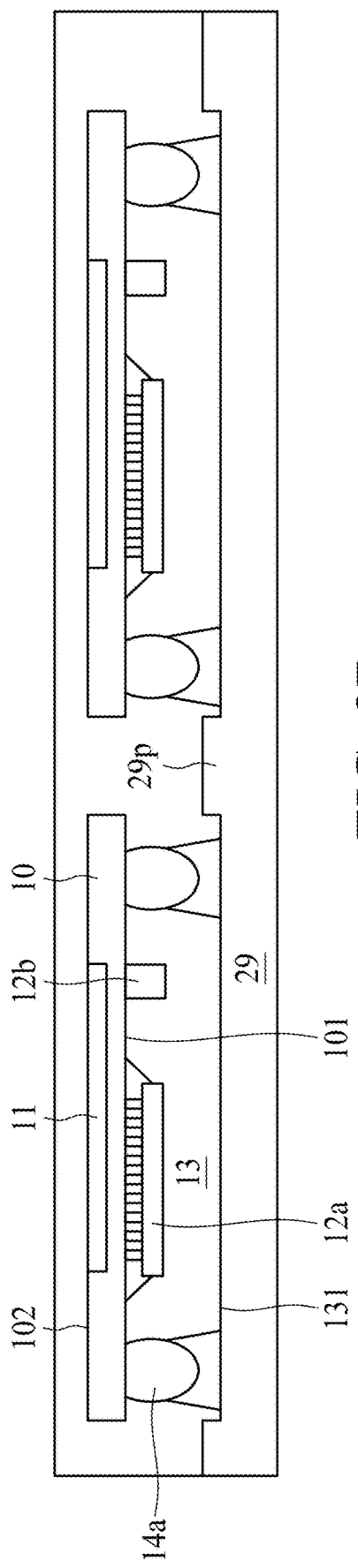

Referring to FIG. 2B, another molding process is applied to the structure in FIG. 2A (e.g., on the surface 102 and the lateral surface of the substrate 10 and the lateral surface of the package body 13') to form the package body 13. The package body 13 covers (e.g. fully covers) the surface mount structures including the surface mount structure 1'. In some embodiments, the package body 13 can be formed by a molding technique, such as transfer molding or compression molding.

Figure 2C:
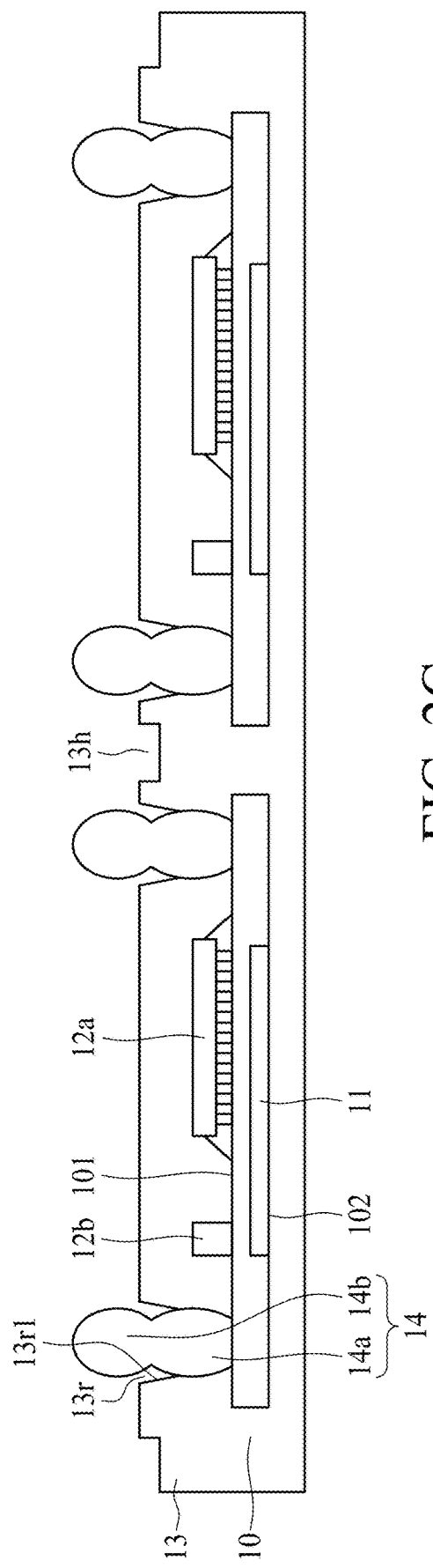

Referring to FIG. 2C, the surface mount structures including the surface mount structure 1' are removed from the carrier 29 to expose the electrical contacts 14a of the surface mount structure 1'. The electrical contact 14b is then formed on the electrical contact 14a of the surface mount structure 1'. In some embodiments, as shown in FIG. 2A, the surface mount structures including the surface mount structure 1' may sink into a surface of the carrier 29, and thus a portion 29p of the surface of the carrier 29 between two adjacent surface mount structures may be higher than a portion of the surface of the carrier 29 on which the surface mount structures are disposed. Therefore, as shown in FIG. 2C, after the carrier 29 is removed, a recess 13h is formed in the package body 13 (e.g. between adjacent surface mount structures).

Figure 2D:
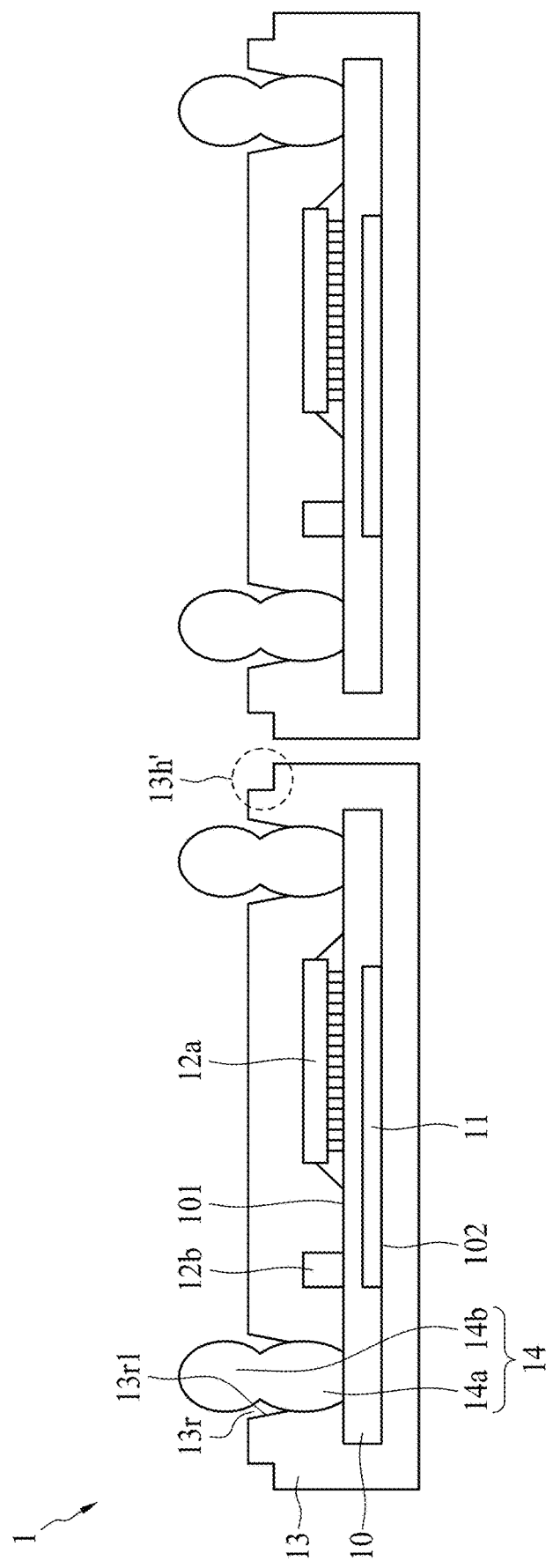

Referring to FIG. 2D, singulation may be performed to separate out individual surface mount structures to form the surface mount structure 1 in FIG. 1A and FIG. 1B. That is, the singulation is performed through the package body 13 and the substrate strip including the substrates 10. The singulation may be performed, for example, by using a dicing saw, laser or other appropriate cutting technique. In some embodiments, the recess 13h can be used as a marker or reference mark for a singulation operation.

As mentioned above, in FIG. 2C, the recess 13h is formed on the package body 13 after the carrier 29 is removed. After the singulation, a notch 13h' may be formed at the corner of the package body 13 as shown in FIG. 2D corresponding to the recess 13h, which can affect the appearance of the surface mount structure 1. To avoid the formation of the notch 13h', a width of a device (e.g., the cutting device) for performing the cutting operation can be equal to or greater than a width of the recess 13h. However, using the cutting device with a such a width may damage or crack the package body 13.

In addition, as shown in FIG. 2A, FIG. 2B, FIG. 2C and FIG. 2D, the surface mount structure 1 is at least formed by two molding processes, two bump mounting processes (one is to form the electrical contact 14a and the other is to form the electrical contact 14b) and one package body removal process (e.g., removing a portion of the package body 13' to expose the electrical contact 14a by laser ablation), which can increase the cost and complexity for manufacturing the surface mount structure 1.

Figure 3A:
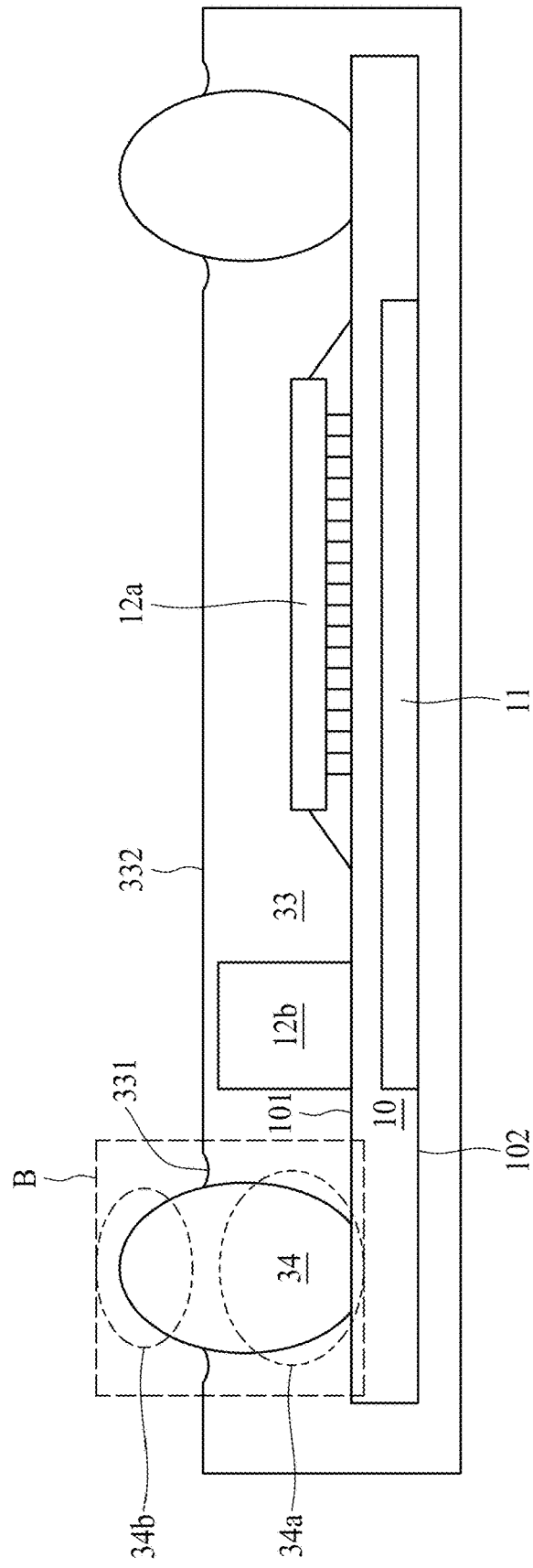
FIG. 3A illustrates a cross-sectional view of a surface mount structure in accordance with some embodiments of the present disclosure.

FIG. 3A illustrates a cross-sectional view of a surface mount structure 3 in accordance with some embodiments of the present disclosure. The surface mount structure 3 is similar to the surface mount structure 1 as shown in FIG. 1A, except that the fan-out structure (e.g., an electrical contact 34) of the surface mount structure 3 and the fan-out structure (e.g. electrical contacts 14a, 14b) of the surface mount structure 1 are different in structure. For example, the fan-out structure of the surface mount structure 1 includes two solder bumps, such as electrical contacts 14a, 14b; while the fan-out structure of the surface mount structure 3 includes one solder bump, such as the electrical contact 34.

Figure 3B:
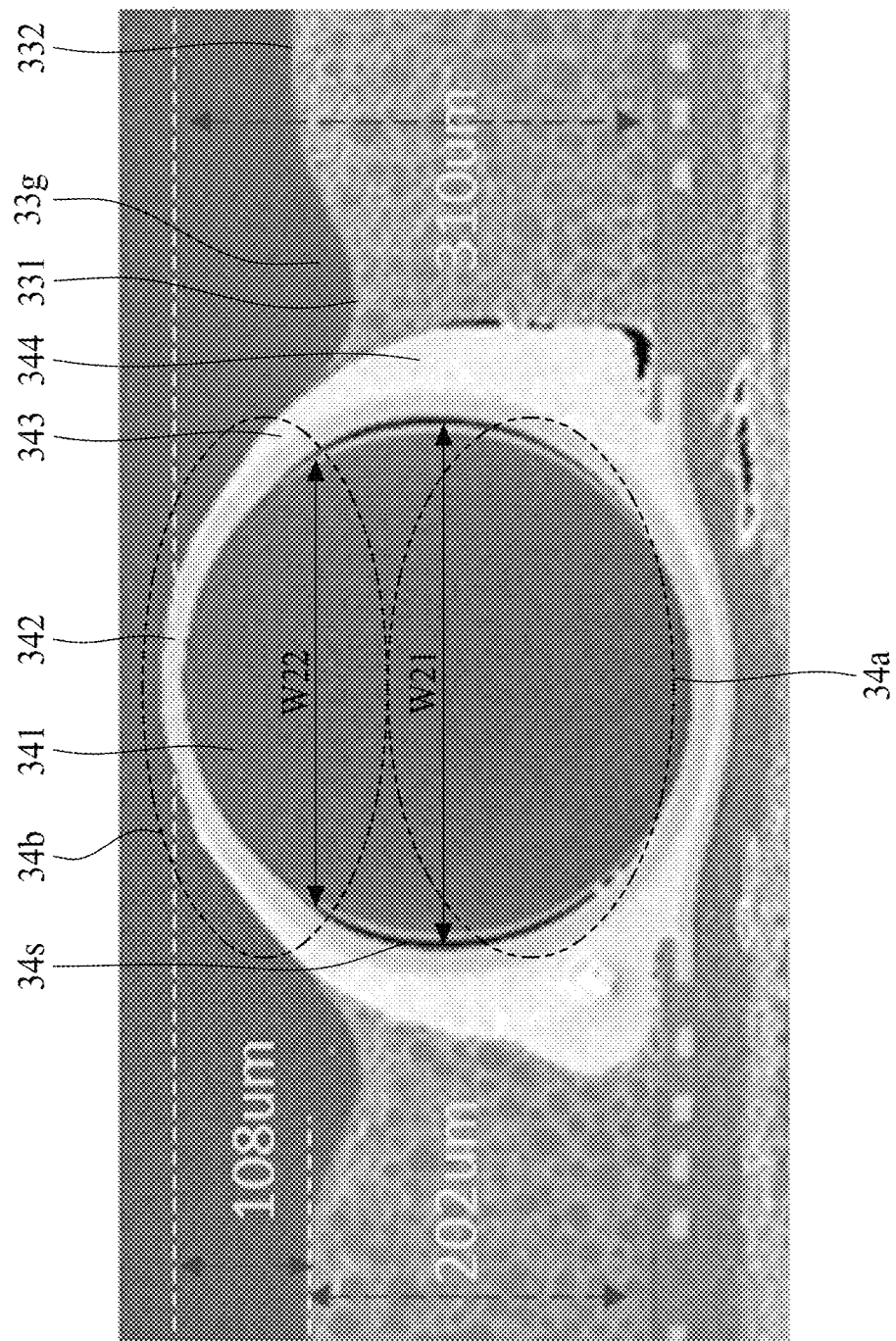
FIG. 3B illustrates an enlarged view of a portion of the surface mount structure in FIG. 3A in accordance with some embodiments of the present disclosure.

The electrical contact 34 is disposed on a surface 101 of the substrate 10. A package body 33 is disposed on the surface 101 of the substrate 10 and covers the surfaces 101 and 102 of the substrate 10, an exposed portion of a sensor 11, electronic components 12a, 12b and a first portion 34a of the electrical contact 34. The package body 33 exposes a second portion 34b of the electrical contact 34. For example, the package body 33 defines an opening to accommodate the first portion 34a of the electrical contact 34. A sidewall of the opening is in contact with the first portion 34a of the electrical contact 34. There may be substantially no gap between the sidewall of the opening and the first portion 34a of the electrical contact 34. In some embodiments, as shown in FIG. 3B, which illustrates an enlarged view of a portion of the surface mount structure 3 in FIG. 3A circled by a dotted-line square B, a width W22 of the opening adjacent to surfaces 331, 332 of the package body 33 is less than a width W21 of the opening at a portion of the package body 33 closer to the substrate 10 than are the surfaces 331, 332 (e.g., adjacent to a portion of the electrical contact 34 having a greatest width), for example, where W22 is about 90% or less, about 85% or less, or about 80% or less of W21. In some embodiments, the portion (e.g., the first portion 34a) of the electrical contact 34 having the greatest width of the electrical contact 34 is covered or surrounded by the package body 33.

In some embodiments, the package body 33 includes an epoxy resin having fillers, a molding compound (e.g., an epoxy molding compound or other molding compound), a polyimide, a phenolic compound or material, a material with a silicone dispersed therein, or a combination thereof. In some embodiments, the package body 33 may include transparent material (e.g. material that is about 80% or more transmissive, about 90% or more transmissive, or about 95% or more transmissive for light that the sensor 11 is configured to process) or opaque material (e.g. material that is about 20% or less transmissive, about 10% or less transmissive, or about 5% or less transmissive for light that the sensor 11 is configured to process) depending on design specifications. In some embodiments, a thickness of the package body 33 above the surface 101 of the substrate 10 is in a range from about 25 micrometers (μm) to about 100 μm.

The package body 33 has the first surface 331, which is adjacent to the electrical contact 34, and a second surface 332, which is spaced apart from the electrical contact 34. The second surface 332 may be adjacent to the first surface 331. For example, the first surface 331 is between the second surface 332 and the electrical contact 34. For example, the second surface 332 and the electrical contact 34 are physically separated from each other by the first surface 331. As shown in FIG. 3B, the first surface 331 and the second surface 332 are not coplanar. For example, at least a portion of the first surface 331 is lower than the second surface 332 (e.g. the first surface is disposed closer to the substrate 10). For example, there is a recess 33g in the surface of the package body 33. For example, the recess 33g is located between the second surface 332 of the package body 33 and the electrical contact 34. The recess 33g may be defined by the first surface 331. The first surface 331 surrounds and is in contact with the first portion 34a of the electrical contact 34, while the second portion 34b of the electrical contact 34 is exposed from the first surface 331. For example, the second portion 34b of the electrical contact 34 protrudes from the first surface 331 and/or the second surface 332 of the package body 33. In some embodiments, the first surface 331 and the second surface 332 may be coextensive, and/or may be portions of a same surface. In some embodiments, the first surface 331 is a first portion of a surface, the first surface 331 defines the recess 33g, and the second surface 332 is a second portion of the surface.

As shown in FIG. 3B, the electrical contact 34 includes a core, which includes an elastic bump 341 (which may be substantially spherical), a metal layer 342 and a barrier layer 343. The metal layer 342 surrounds the elastic bump 341. The barrier layer 343 surrounds at least a portion of the metal layer 342. The electrical contact 34 further includes an outer layer, such as a solder layer 344 surrounding the core. The barrier layer 343 is disposed at the interface between the metal layer 342 and the solder layer 344. A thickness of the barrier layer 343 is relatively thin. In some embodiments, the thickness of the barrier layer 343 is equal to or greater than about 2 μm (e.g. the thickness is about 2.2 μm or more, about 2.4 μm or more, or about 2.6 μm or more). In some embodiments, a thickness of the solder layer 344 is from about 2 μm to about 15 μm.

In some embodiments, the elastic bump 341 can include a polymer. The metal layer 342 can include, for example, copper (Cu), gold (Au), another metal, an alloy, or a combination thereof. The barrier layer 343 can include nickel (Ni) or a Ni alloy. The solder layer 344 can include tin (Sn)-based solders or alloys (e.g., tin-silver-copper (SAC) solder, tin-silver (SnAg) solder, or the like). In some embodiments, the electrical contact 34 may include a Cu core covered by an Sn layer. In some embodiments, the electrical contact 34 may include an Sn core with a relatively high melting point covered by an Sn layer with a relative low melting point. For example, the relatively high melting point may be about 20 degrees Celsius or more, about 50 degrees Celsius or more, about 100 degrees Celsius or more, or about 200 Celsius degrees or more greater than the relatively low melting point. In some embodiments, the electrical contact 34 may include a Cu core covered by a relatively thin Ni layer (e.g., having a thickness equal to or greater than about 2 μm, such as about 2.2 μm or more, about 2.4 μm or more, or about 2.6 μm or more). In some embodiments, the electrical contact 34 may include an Sn core. In some embodiments, the core including the bump 341, the metal layer 342 and the barrier layer 343 is pressed into an elliptical-like or oval-like shape during a molding process wherein a film layer is used to shape the package body 33.

In some embodiments, a modulus of elasticity (e.g., elastic modulus, tensile modulus, or Young's modulus) of the elastic bump 341 can be ranged from approximately 1 GPa to approximately 50 GPa, from approximately 0.5 GPa to approximately 100 GPa, or from approximately 0.1 GPa to approximately 500 GPa, and the elastic bump 341 can recover from the pressed elliptical-like or oval-like shape to a sphere-like shape after the film layer is removed (e.g., having an aspect ratio of about 1, or an aspect ratio in a range of about 0.5 to about 1.5). However, the metal layer 342 and the barrier layer 343 may not recover from the elliptical-like or oval-like shape to the sphere-like shape because the modulus of elasticity (e.g., elastic modulus, tensile modulus, or Young's modulus) of the metal layer 342 and the barrier layer 343 may be relatively high, compared to the modulus of elasticity of the elastic bump 341 (e.g. higher by a factor of about 1.5 or more, about 2 or more, about 5 or more, or about 10 or more). This difference may result in the elastic bump 341 being separated from the metal layer 342 by a space 34s. The metal layer 342 defines an elliptical-like or oval-like space 34s. The space 34s may have little or no matter in it, and may be substantially a vacuum. There may be little or no air or other gas in the space 34s that oxidizes the metal layer 342.

Moreover, due to the relatively lower modulus of elasticity of the elastic bump 341, the height of the portion (e.g., the second portion 34b) of the electrical contact 34 exposed by the package body 33 in FIG. 3B can be readily controlled. As shown in the embodiment of FIG. 3B, the height of the portion (e.g., the second portion 34b) of the electrical contact 34 exposed by the package body 33 can be at least (or larger than), for example, about 100 μm, about 200 μm, or about 400 μm.

FIG. 4A, FIG. 4B, FIG. 4C and FIG. 4D illustrate various stages of a method of manufacturing surface mount structures in accordance with some embodiments of the present disclosure. In some embodiments, the method shown in FIG. 4A, FIG. 4B, FIG. 4C and FIG. 4D can be used to manufacture the surface mount structure 3 in FIG. 3A.

Referring to FIG. 4A, a surface mount structure 3' is provided. In some embodiments, the surface mount structure 3' in FIG. 4A may be formed by the following operations: (i) providing a substrate strip including the substrate 10; (ii) mounting electronic components 12a, 12b and an electrical contact 34 on the substrate strip by, for example, surface mount technology (SMT); and (iii) sawing the substrate strip into individual surface mount structures including the surface mount structure 3'.

Figure 4B:
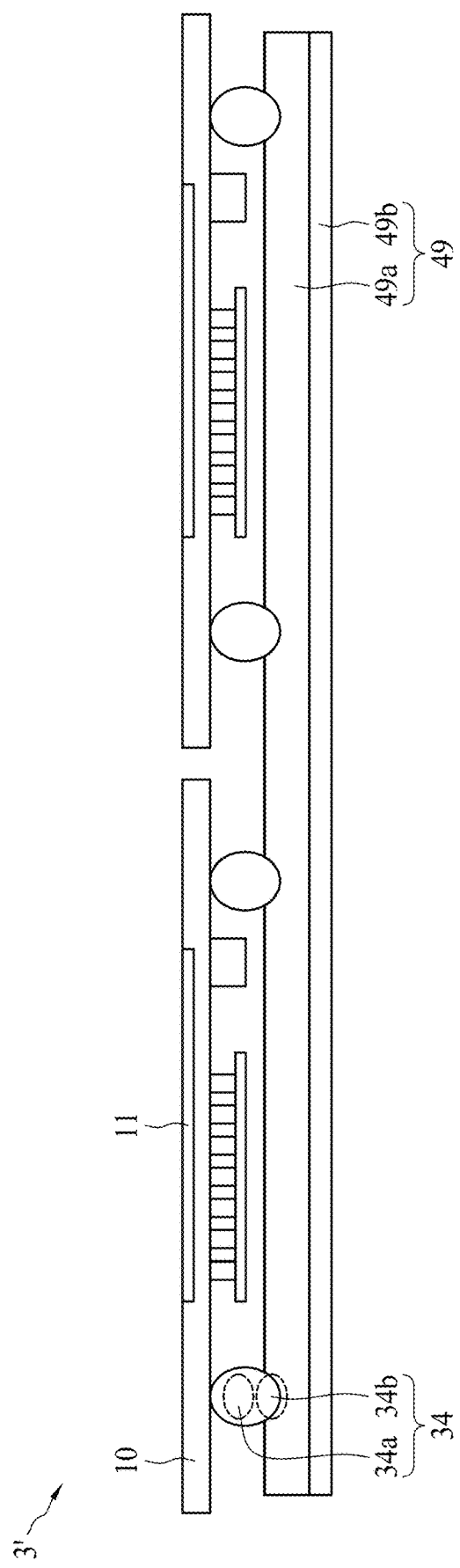

Referring to FIG. 4B, the singulated surface mount structures 3' are placed on a carrier (or a tape) 49. In some embodiments, the carrier 49 includes an adhesive layer 49a on which the surface mount structures 3' are disposed and a hard layer (or firm layer) 49b spaced apart from the surface mount structures 3' by the adhesive layer 49a. The hard layer 49b is used to provide a support for the following operations. In some embodiments, a thickness of the adhesive layer 49a is from about 13 μm to about 200 μm. In some embodiments, the surface mount structures 3' are pressed so that a portion (e.g., the second portion 34b) of the electrical contact 34 sinks into the adhesive layer 49a, while the other portion (e.g., the first portion 34a) is exposed from the adhesive layer 49a.

Figure 4C:
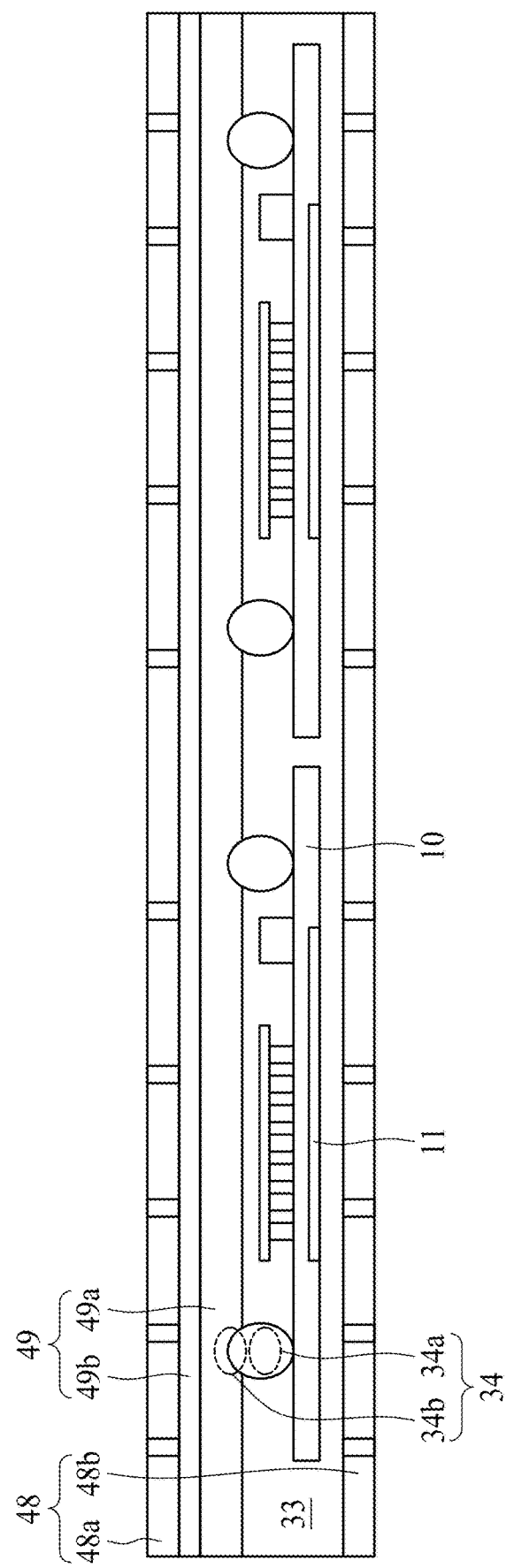

Referring to FIG. 4C, the package body 33 is formed, by for example, a compression molding technique, to cover the adhesive layer 49a and at least a portion of the surface mount structures 3'. For example, the hard layer 49b together with the surface mount structures 3' can be placed on a first portion 48a (e.g., an upper chase) of a molding device (or apparatus) 48, and then molding material is injected from a second portion 48b (e.g., a lower chase) of the molding device 48 toward the first portion 48a of the molding device 48, so the molding material flows from the second portion 48b of the molding device 48 toward the first portion 48a of the molding device 48 to cover the adhesive layer 49a and the surface mount structures 3'. In some embodiments, the second chase 48b is moved toward the first chase 48a to form the package body 33.

Figure 4D:
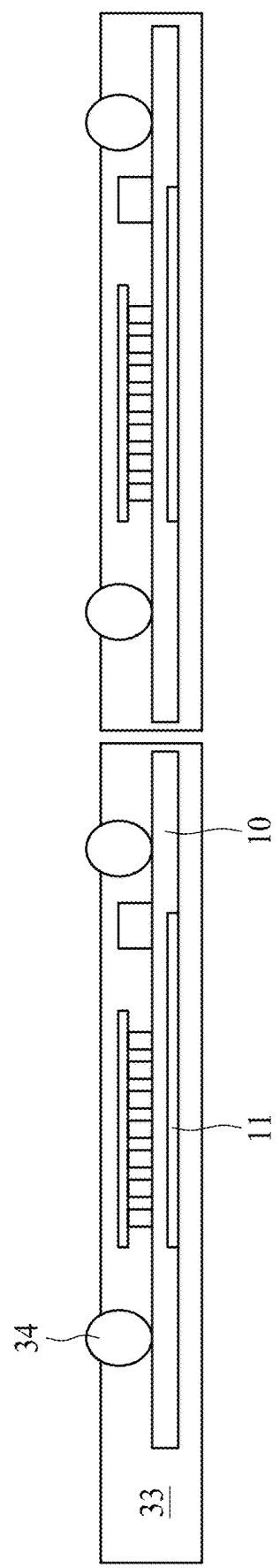

Referring to FIG. 4D, the carrier 49 is removed from the surface mount structures 3' to expose the second portion 34b of the electrical contact 34. Then, singulation may be performed to separate out individual surface mount structures to form the surface mount structure 3 in FIG. 3A. That is, the singulation is performed through the package body 33 and the substrate strip including the substrates 10. The singulation may be performed, for example, by using a dicing saw, laser or other appropriate cutting technique.

As shown in FIG. 4A, FIG. 4B, FIG. 4C and FIG. 4D, the surface mount structure 3 is formed by one molding process and one bump mounting process (e.g. by a single molding process and a single bump mounting process). In addition, a package body removal process (e.g., laser ablation) can be omitted. Therefore, compared with the method shown in FIG. 2A, FIG. 2B, FIG. 2C and FIG. 2D, the method shown in FIG. 4A, FIG. 4B, FIG. 4C and FIG. 4D would reduce the cost and complexity for manufacturing the surface mount structure 3.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

As used herein, the singular terms "a," "an," and "the" may include plural referents unless the context clearly dictates otherwise.

As used herein, the terms "connect," "connected," and "connection" refer to an operational coupling or linking. Connected components can be directly or indirectly coupled to one another, for example, through another set of components.

As used herein, the terms "approximately," "substantially" "substantial," and "about" are used to describe and account for small variations. When used in conjunction with an event or situation, the terms can refer to instances in which the event or situation occurs precisely as well as instances in which the event or situation occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

A surface can be deemed to be planar or substantially planar if a difference between a highest point and a lowest point on the surface is no greater than 5 µm, no greater than 2 µm, no greater than 1 µm, or no greater than 0.5 µm.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device, comprising:
   a substrate having a first surface, a second surface opposite to the first surface, and a lateral surface extending between the first surface and the second surface;
   an electronic component disposed on the first surface of the substrate;
   a first package body covering the electronic component and the first surface of the substrate;
   a second package body covering a lateral surface of the first package body and the lateral surface of the substrate, wherein the second package body covers the second surface of the substrate; and
   a sensor disposed adjacent to the second surface of the substrate.

2. A semiconductor device, comprising:
   a substrate having a first surface, a second surface opposite to the first surface, and a lateral surface extending between the first surface and the second surface;
   an electronic component disposed on the first surface of the substrate;
   a first package body covering the electronic component and the first surface of the substrate;
   a second package body covering a lateral surface of the first package body and the lateral surface of the substrate; and
   an electrical contact electrically connected to the substrate and exposed from the first package body.

3. The semiconductor device of claim 2, wherein the lateral surface of the first package body and the lateral surface of the substrate are substantially coplanar.

4. A semiconductor device, comprising:
   a substrate having a first surface, a second surface opposite to the first surface, and a lateral surface extending between the first surface and the second surface;
   an electronic component disposed on the first surface of the substrate;
   a first package body covering the electronic component and the first surface of the substrate;
   a second package body covering a lateral surface of the first package body and the lateral surface of the substrate; and
   an electronic element disposed proximal to the second surface of the substrate, wherein the electronic element comprises a sensor.

5. The semiconductor device of claim 4, wherein the sensor is configured for sensing through the second package body.

6. The semiconductor device of claim 4, wherein the second package body covers the sensor.

7. The semiconductor device of claim 6, further comprising:
   an electrical contact electrically connected to the substrate and exposed from the first package body.

8. The semiconductor device of claim 7, wherein the first package body has an opening, and a sidewall of the opening is spaced apart from a portion of the electrical contact.

9. The semiconductor device of claim 4, wherein the first package body is in contact with the second package body, and an interface between the first package body and the second package body is substantially aligned with the lateral surface of the substrate.

10. A semiconductor device, comprising:
    a substrate having a first surface, a second surface opposite to the first surface, and a lateral surface extending between the first surface and the second surface;
    an electronic component disposed on the first surface of the substrate;
    a first package body covering the electronic component and the first surface of the substrate;
    a second package body covering a lateral surface of the first package body and the lateral surface of the substrate;

a passive electrical component disposed on the first surface of the substrate; and a sensor adjacent to the second surface of the substrate and encapsulated by the second package body.

11. The semiconductor device of claim 10, wherein the second package body directly contacts a portion of the sensor exposed from the second surface of the substrate.

12. A method of manufacturing a semiconductor device, the method comprising:
   (a) providing a substrate having a first surface, a second surface opposite to the first surface, a lateral surface extending from the first surface and the second surface, and a sensor disposed on the second surface;
   (b) disposing a first electrical contact on the first surface of the substrate; and
   (c) providing a package body covering the sensor, the first surface, the second surface and the lateral surface of the substrate and a portion of the first electrical contact.

13. The method of claim 12, further comprising disposing a second electrical contact on the first electrical contact.

\* \* \* \* \*